United States Patent
Uchida et al.

[11] Patent Number: 6,078,210
[45] Date of Patent: Jun. 20, 2000

[54] INTERNAL VOLTAGE GENERATING CIRCUIT

[75] Inventors: Toshiya Uchida; Yasurou Matsuzaki, both of Kawasaki, Japan

[73] Assignee: Fujitsu Limited, Kawasaki, Japan

[21] Appl. No.: 09/172,092

[22] Filed: Oct. 14, 1998

[30] Foreign Application Priority Data

Apr. 7, 1998 [JP] Japan .................................. 10-094644

[51] Int. Cl.$^7$ ...................................................... H02J 3/38
[52] U.S. Cl. .......................... 327/530; 327/540; 327/541; 330/282; 330/284
[58] Field of Search .................................... 327/530, 537, 327/540, 541, 50, 54, 56; 330/252, 253, 282, 284, 76

[56] References Cited

U.S. PATENT DOCUMENTS

| | | | |
|---|---|---|---|
| 3,742,384 | 6/1973 | Breitzmann et al. | 331/111 |
| 4,479,097 | 10/1984 | Larson et al. | 331/111 |
| 5,166,550 | 11/1992 | Matsubara et al. | 327/66 |
| 5,703,529 | 12/1997 | Ghaffaripour et al. | 330/51 |
| 5,856,756 | 1/1999 | Sasahara et al. | 327/540 |

*Primary Examiner*—Kenneth B. Wells
*Assistant Examiner*—An T. Luu
*Attorney, Agent, or Firm*—Arent Fox Kintner Plotkin & Kahn, PLLC

[57] ABSTRACT

The present invention relates to an internal voltage generating circuit. The internal voltage generating circuit comprises a reference voltage generating circuit for generating a reference voltage, which does not depend on an external power supply; and a comparator including a first input terminal, to which the reference voltage is supplied, a second input terminal, for comparing the voltages of the first and second input terminals and generating an output voltage according to the difference thereof at the output terminal; and an impedance element, which is selectively inserted between the output terminal and the second input terminal of the comparator according to an operation mode. An internal power supply voltage, which has a constant voltage during normal operation and has an accurate higher voltage during acceleration test, can be generated at the output terminal by inserting or not inserting a suitable impedance element between the second input terminal and output terminal according to the operation mode. The above-described comparator can be realized by a common differential amplifying circuit, for example. Further, a reference voltage value at normal operation can be fine-tuned by subdividing the impedance element. In the same way, the voltage value at acceleration test can be also fine-tuned by subdividing the impedance element.

9 Claims, 10 Drawing Sheets

Outline of first embodiment

Outline of first embodiment

A detailed circuit of the first embodiment

Operations of first embodiment

Outline of second embodiment

A detailed circuit of the second embodiment

Outline of third embodiment

Flow chart of adjusting and testing operations

Operations in an internal voltage generating circuit of FIG. 9

INTERNAL VOLTAGE GENERATING CIRCUIT

BACKGROUND OF THE INVENTION

1. Field of the Invention

The present invention relates to an internal voltage generating circuit, which generates an internal power supply voltage for a LSI. More particularly, it relates to an internal voltage generating circuit in which a stable internal power supply voltage for operation can be warranted within a wide range of an external supply voltage during normal operation and a higher internal power supply voltage can be accurately generated during stress operation.

2. Description of the Related Art

A first requirement of an internal voltage generating circuit, which generates an internal supply voltage in an LSI, is to generate a constant internal power supply voltage required for normal operation in internally provided circuits when an externally supplied power supply voltage is within a range warranted in a catalog. Therefore, an internal power supply voltage is generated by dropping the externally supplied power supply voltage. A second requirement is to give a function for rising the internal power supply voltage higher than that when normal operation, when executing an acceleration test involving stress operations to remove an initial defection on a LSI. In other words, the internal power supply voltage in the acceleration test mode requires a prescribed higher voltage.

The conventionally employed power supply voltage of 5 V is transiting to 3.3 V. In recent years, it is transiting to 2.5 V. In this case, only one of the voltages 5 V, 3.3 V and 2.5 V is employed as a power source on a motherboard, on which a LSI is mounted. That requires a LSI such as a memory to adapt every voltage.

FIG. 9 shows a conventional internal voltage generating circuit. The circuit generates the above-described internal power supply voltage during normal operation and an internal power supply voltage during acceleration test. The internal voltage generating circuit shown in FIG. 9 includes a first voltage generating circuit 10, a differential amplifying circuit 12, a second voltage generating circuit 15, a differential amplifying circuit 14 and a synthesis circuit 13. The first voltage generating circuit 10 generates a reference voltage $V_{FLAT}$, and the second voltage generating circuit 15 generates a voltage $V_{BI}$, depends on an external power supply voltage level $V_{DD}$. Further, the synthesis circuit 13 outputs the higher one of the reference voltage $V_{FLAT}$ and the voltage $V_{BI}$ as an internal power supply voltage $V_{INT}$. The external power supply voltage $V_{DD}$ is supplied from an externally provided device, and the internal power supply voltage $V_{INT}$ has a constant voltage during normal operation and a higher voltage during acceleration test operation. The reference voltage $V_{FLAT}$ is employed as an internal power supply when the external power supply voltage $V_{DD}$ is within a warranty voltage range. The voltage $V_{BI}$ goes to a higher level according to the external power supply voltage $V_{DD}$, which goes to a higher level during acceleration test.

FIG. 10 shows an operational explanatory diagram of the internal voltage generating circuit of FIG. 9. The axis of abscissa shows an external power supply voltage $V_{DD}$ and the axis of ordinates shows a voltage value V. The bold line shows a voltage $V_{DD}$ when the external power supply voltage $V_{DD}$ is changed, which is a simple line having a slope angle of 1. The broken line shows a reference voltage $V_{FLAT}$ when the external power supply voltage $V_{DD}$ is changed. The reference voltage $V_{FLAT}$ is 2.5 V when the external power supply voltage $V_{DD}$ is within or around 3.0 V to 3.6 V, which is warranted in a catalog, for example. The chain line shows a voltage $V_{BI}$. When the external power supply voltage $V_{DD}$ exceeds over threshold values of P type transistors P10 and P11, the voltage $V_{BI}$ rises at a slope angle, which is decided according to a resistance value R12, as the external power supply voltage $V_{DD}$ rises. Then, the internal power supply voltage $V_{INT}$ goes to the higher one of the reference voltage $V_{FLAT}$ and the voltage $V_{BI}$, as shown by the reticulate section of FIG. 10.

The first voltage generating circuit of FIG. 9 generates a sum of thresholds of N type transistors Q1 and Q2 as a reference voltage $V_{FLAT}$, which can be expressed as: $V_{FLAT}$ (=$V_{th1}$+$V_{th2}$). In this circuit, when the threshold voltages of the transistors Q1 and Q2 fall according to the temperature fluctuation, conductivity of the transistor Q2 rises. The reference voltage $V_{FLAT}$ falls as an impedance of the transistor Q2 is decreased. According to that, the conductivity of the transistor Q1 falls, currents I1 flowing through a resistor R11 decreases, and the voltage of a gate of the transistor Q2 drops. As a result, an impedance of the transistor Q2 is increased, and therefore, it becomes possible to keep the voltage $V_{FLAT}$ constant. It is also possible to keep the voltage $V_{FLAT}$ constant when the external power supply voltage $V_{DD}$ is changed in the same way.

Additionally, a differential amplifying circuit 12, which is constituted by P type transistors P3 to P5 and N type transistors Q3 to Q5, operates so that the gate voltages of the transistors Q3 and Q4 be coincident. Therefore, the same potential as the reference voltage $V_{FLAT}$ is maintained at a node n1.

On the other hand, the second voltage generating circuit 15, as mentioned above, generates a voltage $V_{BI}$, which rises at a slope angle of a resistance value R12, from the sum of the threshold values 2 Vth of the P type transistors P10 and P11. The differential amplifying circuit 14 operates so that the gate voltages of the N type transistors Q12 and Q13 be coincident, similarly to those of the differential amplifying circuit 12. As a result, the same potential as the voltage $V_{BI}$ can be maintained at the node n1. However, the synthesis circuit 13 selects the higher one of the reference voltage $V_{FLAT}$ and the voltage $V_{BI}$ as an internal power supply voltage $V_{INT}$ of the node n1.

As shown in FIG. 10, if the external power supply voltage $V_{DD}$ is between 3.0 V and 3.6 V, which is a voltage range warranted in a catalog, the internal power supply voltage $V_{INT}$ maintains the reference voltage $V_{FLAT}$. If the external power supply voltage $V_{DD}$ exceeds over the range warranted in a catalog, for example, 4.5 V, when executing an acceleration test, the internal power supply voltage $V_{INT}$ is controlled so as to be a high voltage $V_{BI}$ for acceleration test, for example, 3.5 V.

Although the internal power supply voltage for acceleration test requires the voltage $V_{BI}$ of almost 3.5 V, if the voltage is too high, the voltage breaks internal circuits. On the contrary, if the voltage is too low, the LSI where an initial defection occurs can not be accurately detected because of insufficient stress at the acceleration test. Therefore, the internal power supply voltage at the acceleration test should be accurately generated at a pinpoint. In the second voltage generating circuit 15 of the internal voltage generating circuit, the voltage $V_{BI}$ is decided depending on the threshold voltages of the P type transistors P10 and P11 and the resistance value R12. However, the threshold values of the P type transistors P10 and P11 are generally dispersed depending on the processes. Therefore, it is difficult to accurately generate the voltage $V_{BI}$ (3.5 V) of the internal power supply voltage at the acceleration test in the conventional internal voltage generating circuit.

To avoid the problem of the dispersion of the thresholds depending on the processes, it can be assumed that resistors are provided instead of the P type transistors P10 and P11 of the second voltage generating circuit 15 of FIG. 9 to generate the voltage $V_{BI}$ by subdividing the external power supply voltage $V_{DD}$ according to the resistances. However, the voltage has a character like the voltage $V_{BI}2$ shown in FIG. 10, and therefore, it becomes impossible to generate enough high internal power supply voltage for acceleration test. It is further impossible to keep the internal power supply voltage $V_{INT}$ constant within a catalog warranted voltage range.

SUMMARY OF THE INVENTION

Accordingly, it is an object of the present invention to provide an internal voltage generating circuit which can generate a constant voltage as an internal power supply voltage for obtaining a stable device characteristic at normal operation, and an accurate higher internal power supply voltage for acceleration test during the acceleration test.

It is another object of the present invention to provide an internal voltage generating circuit in which an accurate internal power supply voltage for acceleration test can be generated without affecting dispersion caused by processes.

It is a further object of the present invention to provide an internal voltage generating circuit in which an internal power supply voltage level for normal operation can be fine-tuned.

It is a furthermore object of the present invention to provide an internal voltage generating circuit in which a high internal power supply voltage level for acceleration test can be fine-tuned.

To achieve the above-described objects, according to the present invention, an internal voltage generating circuit comprises: a reference voltage generating circuit for generating a reference voltage, which does not depend on an external power supply; and a comparator including a first input terminal, to which the constant voltage is supplied, a second input terminal, for comparing the voltages of the first and second input terminals and generating an output voltage according to the difference thereof at the output terminal; and an impedance element, which is selectively inserted between the output terminal and the second input terminal of the comparator according to an operation mode. An internal power supply voltage, which has a constant voltage during normal operation and has an accurate higher voltage during acceleration test, can be generated at the output terminal by inserting or not inserting a suitable impedance element between the second input terminal and output terminal according to the operation mode. The above-described comparator can be realized by a common differential amplifying circuit, for example. Further, a reference voltage value at normal operation can be fine-tuned by subdividing the impedance element. In the same way, the voltage value at acceleration test can be also fine-tuned by subdividing the impedance element.

To achieve the above-described objects, according to a first aspect of the present invention, provided is an internal voltage generating circuit, which generates internal power supply voltage for a normal operation and a test operation employing an external power supply comprising: a reference voltage generating circuit, to which the external power supply voltage is supplied, for generating a reference voltage; a comparator, having a first input terminal, to which the reference voltage is supplied, a second input terminal and an output terminal, for comparing voltages of the first and second input terminals and generating an output voltage at the output terminal according to the difference of the voltages; and a prescribed impedance element, which is selectively inserted between the output terminal and the second input terminal in the comparator according to the normal operation or the test operation, wherein the internal power supply voltage is generated at the output terminal of the comparator.

According to the above invention, it becomes possible to generate an accurate internal power supply for the test operation, which is not affected by dispersion caused by processes, and generate an internal power supply voltage of a reference voltage value at the normal operation by suitably setting the impedance value of the impedance element.

Further, to achieve the above-described objects, according to a second aspect of the present invention, provided is an internal voltage generating circuit, which generates internal power supply voltages for a normal operation and a test operation employing an external power supply, comprising: a reference voltage generating circuit, to which the external power supply is supplied, for generating a reference voltage; a comparator, having a first input terminal, to which the reference voltage is supplied, a second input terminal and an output terminal, for comparing voltages of the first and second input terminals and generating an output voltage according to the difference of the voltages at the output terminal; a first switch for selectively inserting a prescribed impedance element between the output terminal and the second input terminal of the comparator according to the normal operation or the test operation; a second switch for selectively changing an impedance value of the impedance element; and an internal memory for storing an adjusting signal for controlling the second switch circuit, wherein the internal power supply voltage is generated at the output terminal of the comparator.

According to the above present invention, the internal power supply voltage level can be accurately fine-tuned by the adjusting signal.

DESCRIPTION OF THE PREFERRED EMBODIMENTS

The preferred embodiments of the present invention will now be described while referring to the accompanying drawings. The technical scope of the present invention, however, is not limited to these embodiments.

Figure 1:
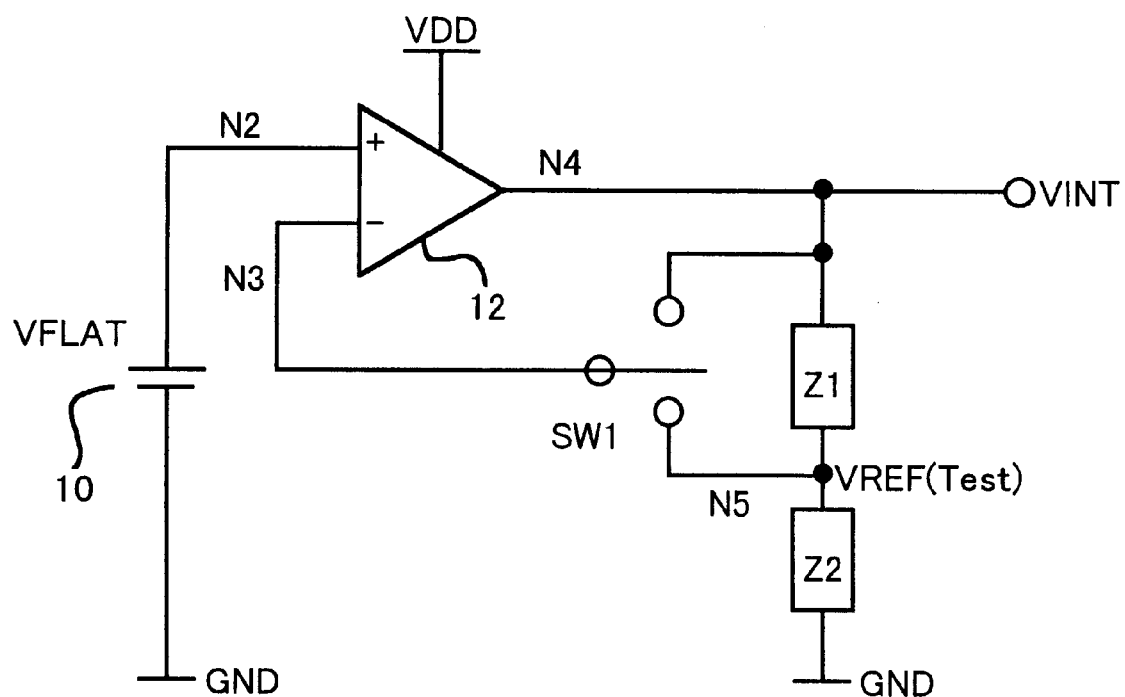
FIG. 1 shows an outline of a first embodiment of the present invention.

FIG. 1 shows an outline of a first embodiment of the present invention. The circuit according to the first embodiment of FIG. 1 includes a reference voltage generating circuit 10, a differential amplifying circuit 12, plural impedance elements Z1 and Z2, and a switch SW1. The reference voltage generating circuit 10 generates a reference voltage $V_{FLAT}$, which is supplied to a first input terminal N2 of the differential amplifying circuit 12. The plural impedance elements Z1 and Z2 are connected between an output terminal N4 and a ground GND. The switch SW1 can selectively connect a connecting point N5 between the impedance elements Z1 and Z2 to an input terminal N3. An internal power supply voltage $V_{INT}$ is generated at the output terminal N4 of the differential amplifying circuit 12.

In the example of FIG. 1, the differential amplifying circuit 12 generates a voltage of the output terminal N4 according to a potential difference between the input terminals N2 and N3 so as to remove the potential difference. In other words, assuming the switch SW1 is connected to the output terminal N4, the internal power supply voltage $V_{INT}$ at the output terminal N4 becomes the same as the reference voltage $V_{FLAT}$. Additionally, when the switch SW1 is connected to the connecting point N5 between the impedance elements Z1 and Z2, the differential amplifying circuit 12 activates so that a reference voltage $V_{REF}$ of the node N5 becomes the same as the reference voltage $V_{FLAT}$. Therefore, the voltage $V_{INT}$ of the output terminal N4 follows a ratio of the resistors of the impedance elements Z1 and Z2. This can be expressed as:

$$V_{INT} = V_{FLAT} \times (Z1+Z2)/Z2$$

where the internal power supply voltage level $V_{INT}$ becomes higher than the reference voltage level $V_{FLAT}$ according to the ratio of the resistors of the impedance elements Z1 and Z2.

Therefore, a LSI, in which the internal voltage generating circuit of FIG. 1 is employed, becomes an acceleration test mode in response to an external signal supplied to an external test terminal or an internal signal generated from a combination of commands or address signals. Then, the LSI connects the switch SW1 to the node N5. Additionally, the LSI connects the switch SW1 to the output terminal N4 at a normal operation. As a result, the problem such that the internal power source voltage at the acceleration test becomes inaccuracy according to the dispersion caused by the processes in the conventional circuit can be avoided. It becomes also possible to make the internal power supply voltage constant at the normal operation with respect to a wide range of the external power supply voltage $V_{DD}$.

Figure 2:
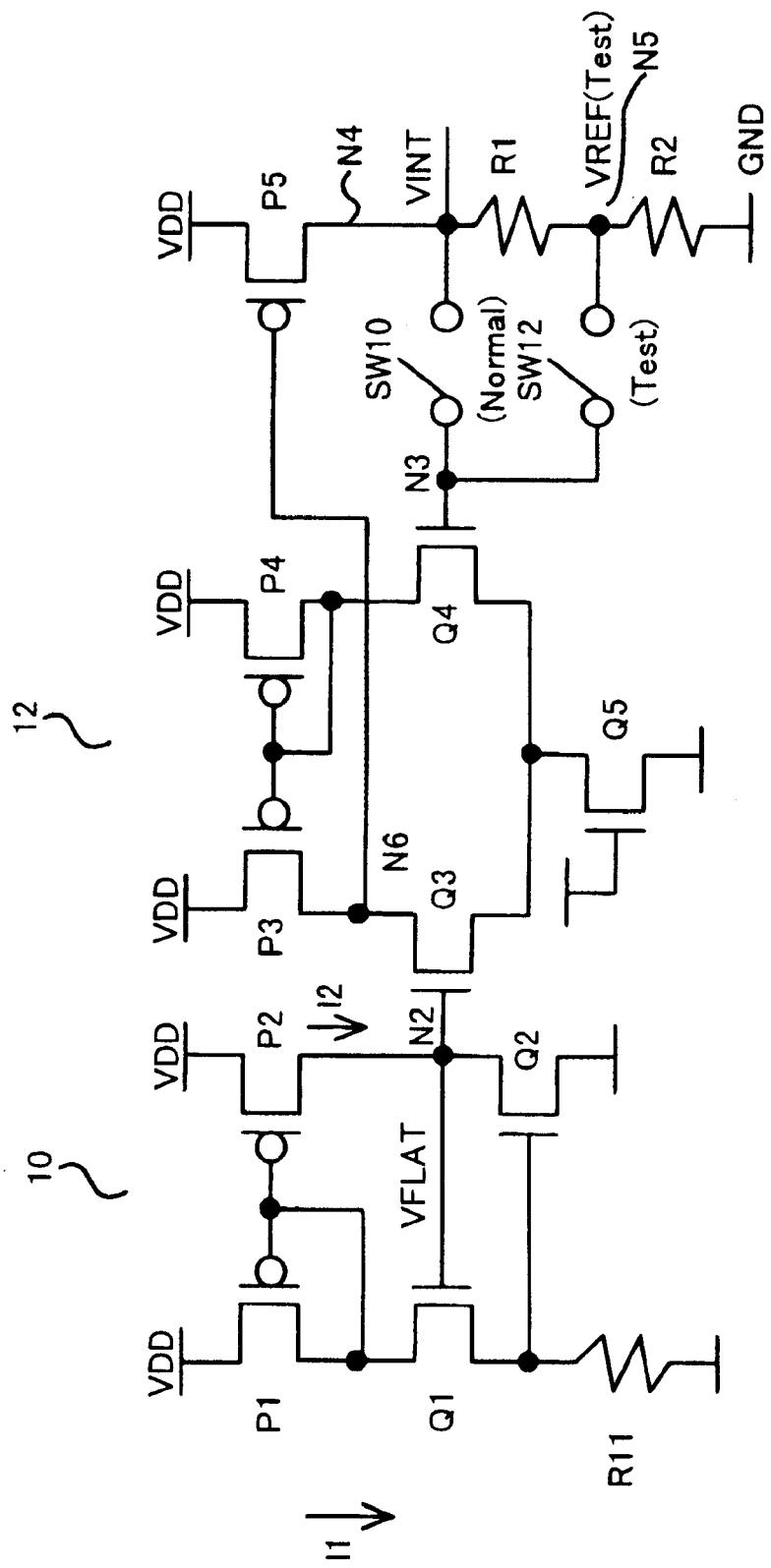
FIG. 2 is a detailed circuitry diagram of the first embodiment.
Figure 9:
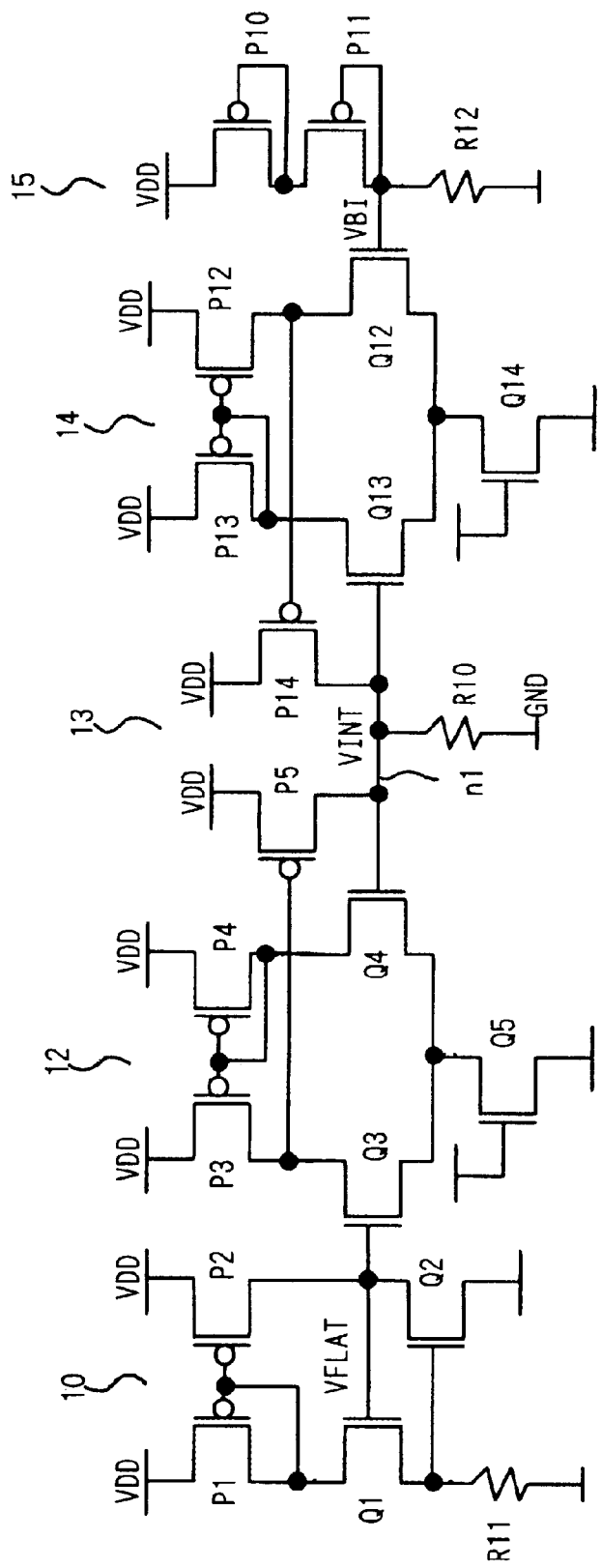
FIG. 9 is a conventional internal voltage generating circuit.
Figure 10:
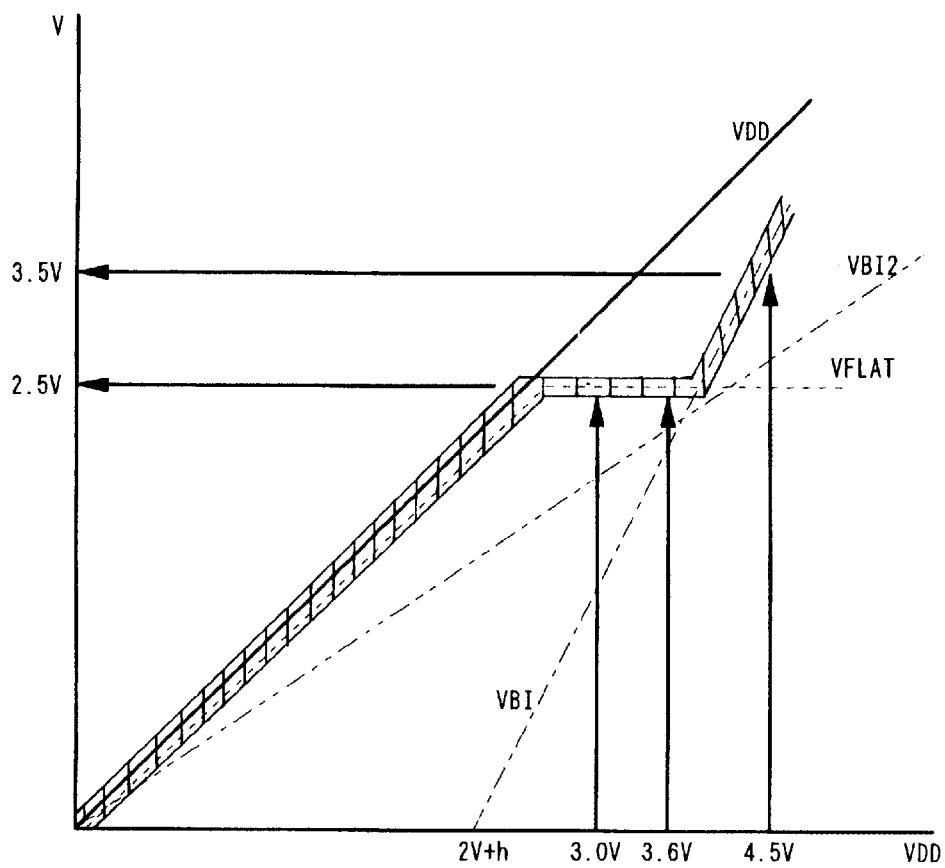
FIG. 10 is an explanatory diagram of operations in the internal voltage generating circuit of FIG. 9.

FIG. 2 is a detailed circuitry diagram of the first embodiment of FIG. 1. A reference voltage generating circuit 10 of the internal voltage generating circuit in FIG. 2 is the same as that of the conventional circuit shown in FIG. 9. In other words, the reference voltage generating circuit 10 includes P type transistors P1 and P2, N type transistors Q1 and Q2, and a resistor R11. The P type transistors P1 and P2 constitute as a current miller circuit. Currents I1 and I2 are supplied from the current miller circuit in the constant ratio of 1 to 1, for example.

The differential amplifying circuit 12, which constitutes a comparator, includes P type transistors P3 and P4, N type transistors Q3 and Q4, an N type transistor Q5, and a P type transistor P5. The P type transistors P3 and P4 constitutes a current miller circuit. Input terminals N2 and N3 are supplied to gates of the N type transistors Q3 and Q4 of which source terminals are commonly connected. The N type transistor Q5 is a current source, and a drain terminal of the transistor Q3 is connected to a gate of the P type transistor P5. A source terminal of the transistor P5 is connected to an output terminal N4 to output an internal power supply voltage $V_{INT}$.

Resistors R1 and R2, which are impedance elements, are connected between the output terminal N4 and a ground source GND. Switches SW10 and SW12 selectively connect the second input terminal N3 to the output terminal N4 or the node N5. The switches SW10 and SW12 are controlled by an acceleration test mode detecting circuit, not shown in FIG. 2.

Figure 3:
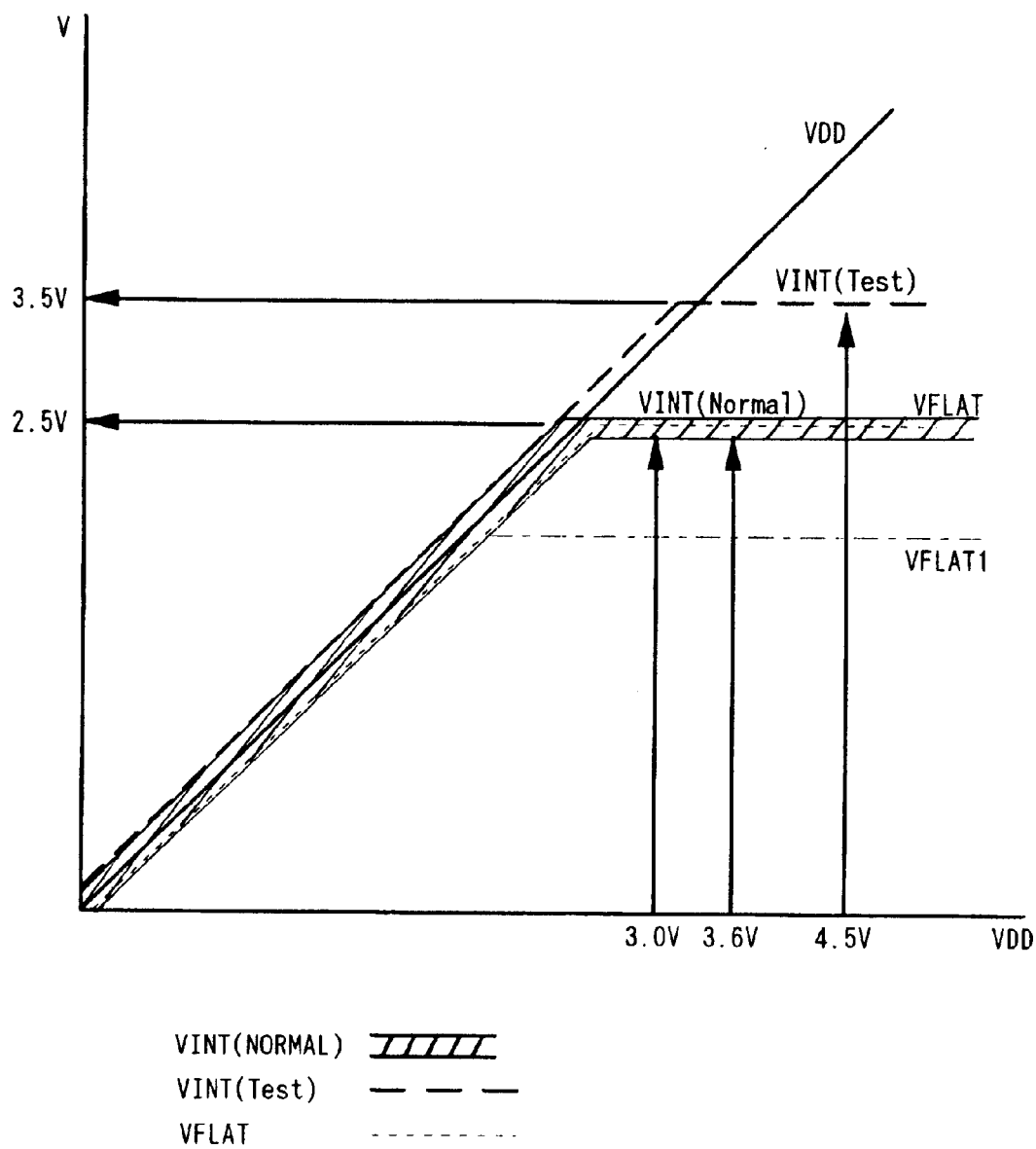
FIG. 3 is an explanatory diagram of operations in the first embodiment.

FIG. 3 is an operational explanatory diagram of the first embodiment. Operations in the circuit of FIG. 2 will be now explained in accompanying to FIG. 3.

The reference voltage generating circuit 10 is the same as the circuit explained in the prior art. The circuit 10 generates a constant reference voltage $V_{FLAT}$ at a node N2 without depending on changes of the threshold voltages caused by temperature fluctuation or the external power supply voltage $V_{DD}$. The reference voltage $V_{FLAT}$ has a level of the sum of the threshold voltages of the N type transistors Q1 and Q2 ($V_{th1}+V_{th2}$).

Assuming the switch SW10 is closed and the output terminal N4 is connected to the second input terminal N3, the differential amplifying circuit 12 controls the voltage of the output terminal N4 according to the potential difference between the input terminals N2 and N3 so that the potential difference becomes zero. As the potential at the second input terminal N3 is reduced, the conductivity of the transistor Q3 rises, the conductivity of the transistor P3 falls, and therefore, the potential at the node N6 is reduced, for example. In response to that, the conductivity of the P type transistor P5 rises and the potential at the output terminal N4 is increased. When the voltage of the second input terminal N3 connected to the output terminal N4 becomes the same as that of the first input terminal N2, the differential amplifying circuit 12 becomes stable. As a result, the voltage of the second input terminal N3 can be always maintained to the reference voltage $V_{FLAT}$ of the first input terminal N2. The internal power supply voltage $V_{INT}$ of the output terminal N4 connected to the input terminal N3 can be also maintained to the reference voltage $V_{FLAT}$ in the same way.

In this example, the differential amplifying circuit 12 compares voltages of the input terminals and generates a prescribed voltage at the output terminal so that the difference of the both voltages becomes zero. The circuit 12 further closes current paths $I_1$ and $I_2$ in the reference voltage generating circuit 10 and transmits the generated reference voltage $V_{FLAT}$ to the output terminal. Therefore, the circuit 12 is not necessarily a differential amplifying circuit as long as the circuit 12 includes the above-described functions. However, a differential amplifying circuit will be now employed in the preferred embodiments.

When the acceleration test mode detector, not shown in the diagram, detects the mode is for an acceleration test, the switch SW12 is closed. Even if the switch SW12 is closed, operations in the differential amplifying circuit 12 are not changed, i.e., the circuit 12 controls the voltage at the output terminal N4 so that the voltage difference between both of the input terminals becomes zero in the differential amplifying circuit 12. Therefore, the node N5 connected to the second input terminal N3 via the switch SW12 can be maintained at the reference voltage $V_{FLAT}$. As a result, the internal power supply voltage $V_{INT}$ at the output terminal N4, of which resistance is subdivided, can be expressed as:

$$V_{INT}=V_{REF}\times(R1+R2)/R2=V_{FLAT}\times(R1+R2)/R2$$

The internal power supply voltage $V_{INT}$ when the switch SW12 is closed can be accurately set to 3.5 V, as described above, by appropriately setting the resistance values R1 and R2. However, in this case, the external power supplyvoltage $V_{DD}$ is required to be equal to or more than the internal power supply voltage 3.5 V.

As explained in the operational explanatory diagram of FIG. 3, the reference voltage $V_{FLAT}$, as shown by the broken line of FIG. 3, generated by the reference voltage generating circuit 10 becomes 2.5 V, for example, even if the external power supply voltage $V_{DD}$ is between 3.0 V and 3.6 V, which is a normal operational range, or higher than the range. Therefore, if the switch SW10 is closed during normal operation, the internal power supply voltage $V_{INT}$ (normal) becomes a reference voltage $V_{FLAT}$ generated by the reference voltage generating circuit 10, which is shown by a shadowed section of FIG. 3. In other words, if the external power supply voltage $V_{DD}$ is around the normal operation range or more, the internal power supply voltage $V_{INT}$ (normal) can maintain a desired constant voltage $V_{FLAT}$ of 2.5 V. Next, when operating in an acceleration test mode, the switch SW12 is closed and the internal power supply voltage $V_{INT}$ (Test) goes to a high voltage (3.5 V in the diagram) according to the ratio of the resistors. The internal power supply voltage $V_{INT}$ (test) at the acceleration test is not affected by the processes of the threshold voltages of the transistors or the temperature fluctuation as shown in the prior art. Therefore, a prescribed voltage can be accurately generated.

Figure 4:
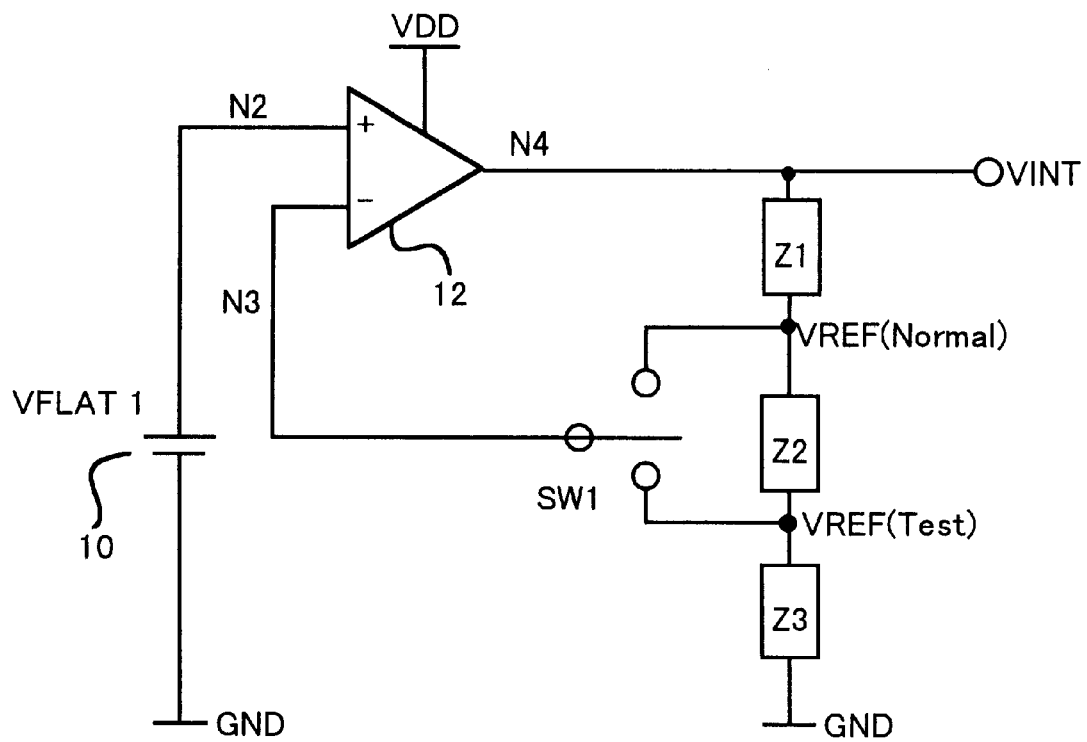
FIG. 4 shows an outline of a second embodiment of the present invention.

FIG. 4 shows an outline of a second embodiment of the present invention. This example is employed when a reference voltage value $V_{FLAT}1$, which is generated by a reference voltage generating circuit 10, is lower than an internal power supply voltage $V_{INT}$ during normal operation. Since the reference voltage value $V_{FLAT}1$ is lower, three impedance elements Z1 to Z3 are provided between an output terminal N4 of a differential amplifying circuit 12 and a ground GND. A switch SW1 selectively connects two connecting points of the three impedance elements Z1 to Z3 to a second input terminal N3.

The switch Sw1 connects the connecting point between the impedance elements Z1 and Z2 when operating in a normal mode. As a result, the input voltage $V_{REF}$ (normal) becomes the same as the reference voltage value $V_{FLAT}1$. Then, the voltage value more than the reference voltage value $V_{FLAT}1$ is generated as an internal power supply voltage value $V_{INT}$ at an output terminal N4 according to the ratio of the resistors of the impedance elements Z1 to Z3. The operations of the differential amplifying circuit 12 are the same as those of the first embodiment. This can be expressed as:

$$V_{INT}=V_{FLAT}1\times(Z1+Z2+Z3)/(Z2+Z3).$$

The switch SW1 alternatively connects the connecting point of the impedance elements Z2 and Z3 when operating in acceleration test mode. As a result, the input voltage $V_{REF}$ (test) becomes the same as the reference voltage value $V_{FLAT}1$. Therefore, the internal power supply voltage value $V_{INT}$ becomes higher than the reference voltage value $V_{FLAT}1$, and higher than that at normal operation as well. That can be expressed as:

$$V_{INT}=V_{FLAT}1\times(Z1+Z2+Z3)/Z3.$$

A chain line of the explanatory diagram of FIG. 3 shows the reference voltage level $V_{FLAT}1$ of the second embodiment.

Figure 5:
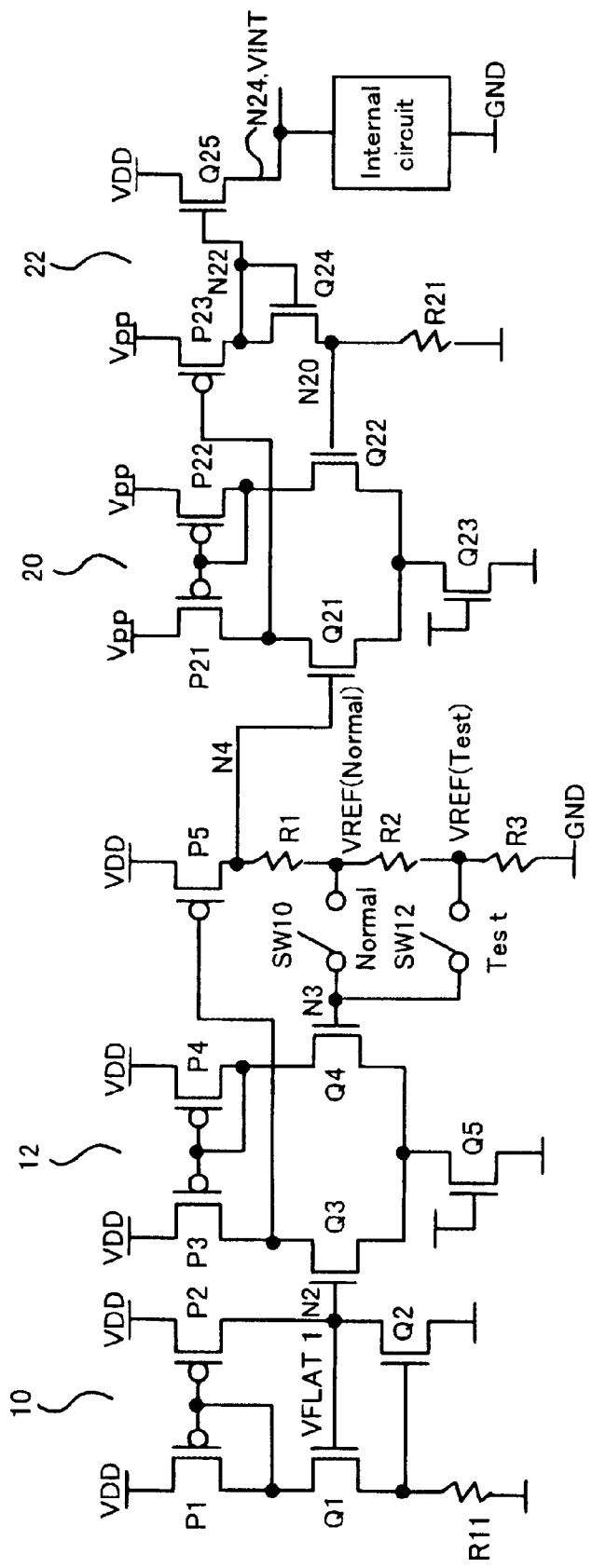
FIG. 5 is a detailed circuitry diagram of the second embodiment.

FIG. 5 is a detailed circuitry diagram of the second embodiment. The detailed circuitry diagram includes three resistors R1 to R3 connected between an output terminal N4 and a ground, in addition to a reference voltage circuit 10 and a differential amplifying circuit 12, which is the same as those of the detailed circuit of FIG. 2. The output terminal N4 is further connected to an input terminal of the other differential amplifying circuit 20, an output terminal N22 of the differential amplifying circuit 20 is connected a source follower type N channel transistor Q25 at the last stage. A source terminal N24 of the transistor Q25 at the last stage outputs an internal power supply voltage $V_{INT}$ supplied to an internally provided circuit.

Operations of the reference voltage generating circuit 10 and the differential amplifying circuit 12 are the same as those of FIG. 2. When operating in a normal mode, i.e., the switch SW10 is closed, a slightly higher voltage than the constant voltage $V_{FLAT}1$ is generated in the output terminal N4 because of providing a resistor R1, as explained in FIG. 4.

The second differential amplifying circuit 20 transmits the voltage $(V_{FLAT}1+\alpha)$ generated at the output terminal N4 to a terminal N20. The same voltage as that of the terminal N4 is generated at the input terminal N20. The terminal N20 is connected to a terminal N22 through the N type transistor Q24, which is connected by a diode. Therefore, the voltage level of the terminal N22 is increased by threshold voltages $V_{th}$ of the transistor Q24 from the voltage at the output terminal N4 $(V_{FLAT}1+\alpha)$. Then, the voltage $(V_{FLAT}1+\alpha)$ at the output terminal N4 is generated in the source terminal N24 of the N type transistor Q25 at the last stage. The internal power supply voltage $V_{INT}$ generated at the terminal N24 is supplied to the internal circuit.

In the circuit of FIG. 5, the switch SW12 is closed and a high voltage according to a ratio of the resistors R1 to R3 is generated in the output terminal N4. This voltage is 3.5 V, for example, as shown in FIG. 3. As a result, the internal power supply voltage $V_{INT}$ at the terminal N24 is also accurately being 3.5 V.

Figure 6:
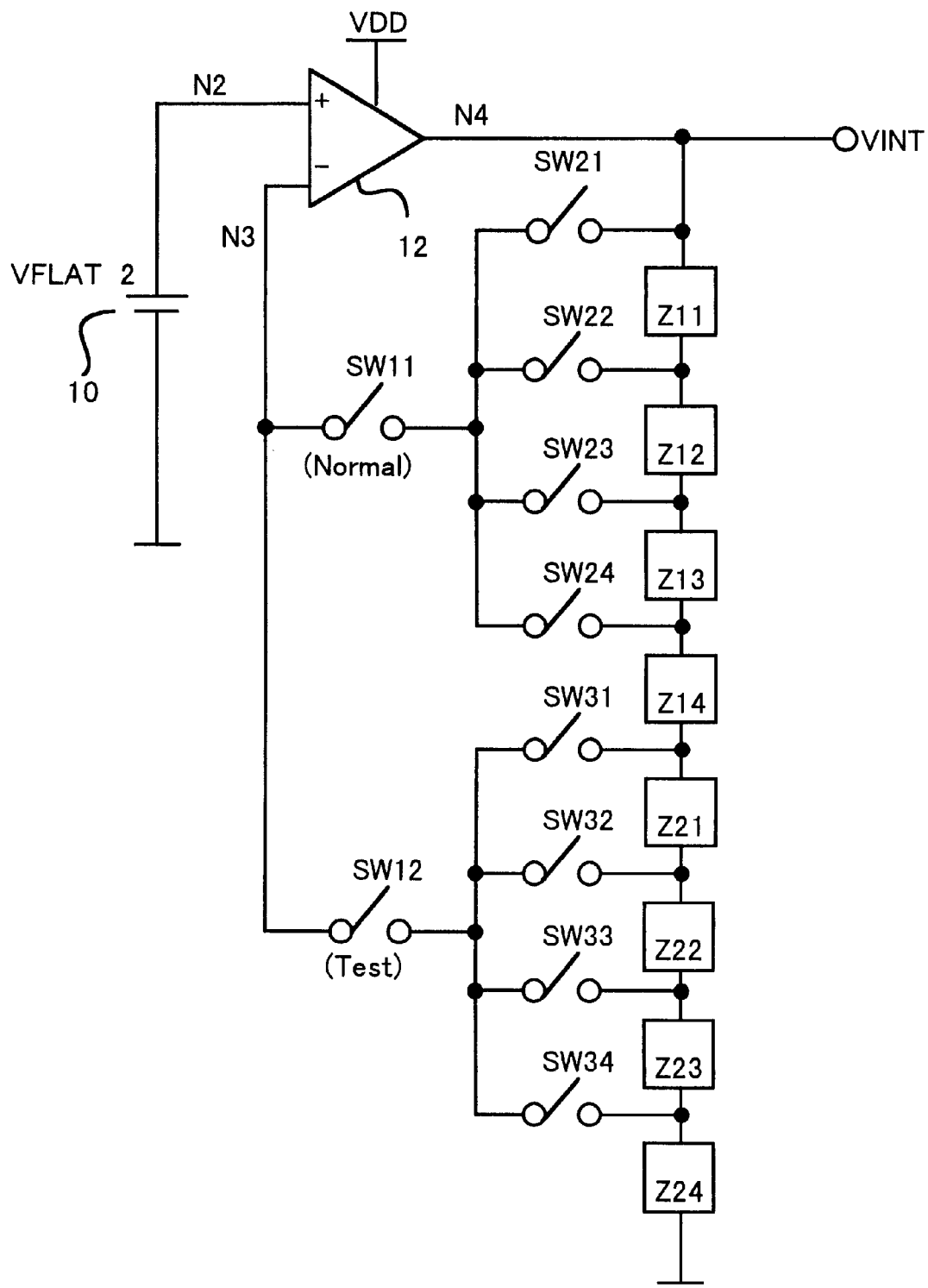
FIG. 6 shows an outline of a third embodiment of the present invention.

FIG. 6 shows an outline of a third embodiment. In this example, the impedance element Z1 of the first embodiment, which is shown in FIG. 1, is divided into plural impedance elements Z11 to Z14. Further, the impedance element Z2 is divided into plural impedance elements Z21 to Z24. When operating in a normal mode, the switch SW1 is closed. On the contrary, when operating in an acceleration test (stress test) mode, the switch SW12 is closed. Therefore, a test mode detecting circuit, not shown in FIG. 6, selectively switches SW11 and SW12.

The switches SW21 to SW24 are selectively closed according to a control signal, not shown in FIG. 6, to fine-tune the voltage of the internal power supply voltage $V_{INT}$ generated at the output terminal N4 when operating in a normal mode. In the same way, the switches SW31 to SW34 are selectively closed according to a control signal, not shown in FIG. 6, to fine-tune a high internal power supply voltage $V_{INT}$ generated at the output terminal N4 when operating in an acceleration test mode. Therefore, a potential difference between the internal power supplies when operating in a normal mode or acceleration test mode is mainly set according to the impedance elements Z14 and Z24. Further, the internal power supply voltage values $V_{INT}$ are fine-tuned by the impedance elements Z11 to Z13 and Z21 to Z23. In other words, the impedances of the impedance elements Z11 to Z13 and Z21 to Z23 are enough small than that of the impedance elements Z14 and Z24.

The same voltage as the reference voltage $V_{FLAT}2$ at the other input terminal N2 is maintained at the input terminal N3 according to the operations in the differential amplifying circuit 12. Therefore, the voltage at the output terminal N4 is decided depending on the closed switch.

Figure 7:
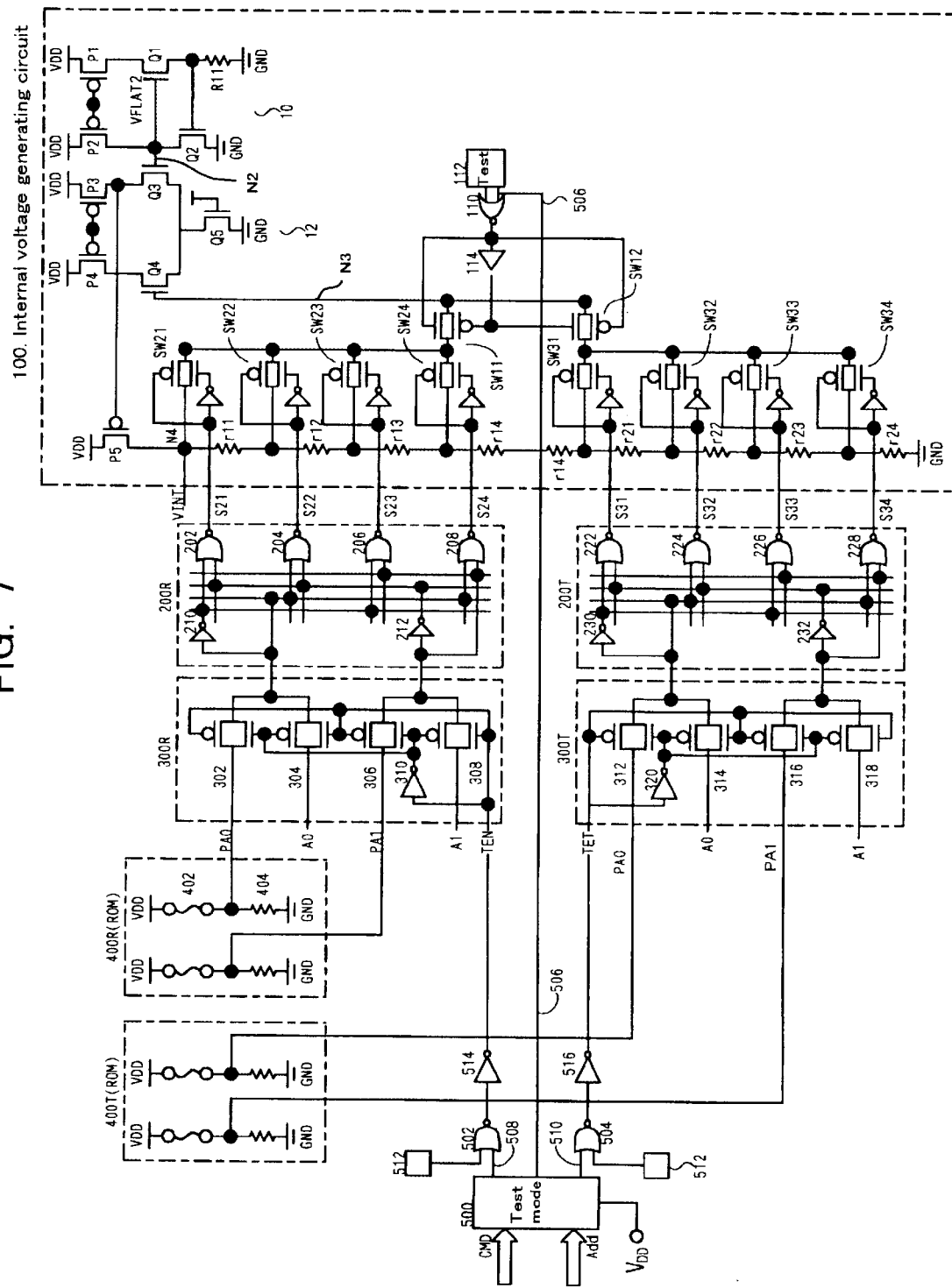
FIG. 7 is a detailed circuitry diagram of the third embodiment.

FIG. 7 shows a detailed circuitry diagram of a third embodiment. The detailed circuit of FIG. 7 includes an internal voltage generating circuit 100, a decoder 200R for normal mode, a switch circuit 300R, a program ROM 400R, a decoder 200T for test mode, a switch circuit 300T, a program ROM 400T and a test mode detecting circuit 500. The switch circuits 300R and 300T select either addresses PA0 and PA1 recorded in the program ROMs 400R and 400T or addresses A0 and A1 provided from external terminals. This selection is controlled by adjusting mode signals 508 and 510 sent from the test mode detecting circuit 500, for identifying a normal internal ROM mode or an externally adjusting mode, or by a control signal from the externally adjusting mode terminal 512. The externally adjusting mode terminal 512 switches the modes on a wafer stage, and the adjusting mode signals 508 and 510 of the test mode detecting circuit 500 switches the modes after encapsulated in a package. The addresses A0, A1, PA0 and PA1 fine-tune the voltage at the output terminal N4.

The switch circuit 300R includes CMOS switches 302, 304, 306 and 308. The CMOS switches 302 and 306 become conductive when operating in the internal ROM mode to transit addresses PA0 and PA1 sent from the ROM 400R to a decoder 200R. The CMOS switches 304 and 308 become conductive when operating in the adjusting mode to transit the addresses A0 and A1 sent from the external terminal to the decoder 200R. The switch circuit 300T includes CMOS switches 312, 314, 316 and 318. The CMOS switches 312 and 316 become conductive when operating in the internal ROM mode to transit the addresses PA0 and PA1 sent from the ROM 400T to the decoder 200T. The COMS switches 314 and 318 become conductive when operating the adjusting mode to transit the addresses A0 and A1 sent from the external terminals to the decoder 200T.

The decoders 200R and 200T decode these selected addresses and respectively output selection signals S21 to S24 and S31 to S34. These selection signals control to close one of the switches SW21 to SW24 and SW31 to SW34 in the internal voltage generating circuit 100.

The decoder 200R includes inverters 210 and 212 and NAND gates 202 to 208. The decoder 200T includes inverters 230 and 232 and NAND gates 222 to 228.

The internal voltage generating circuit 100 is a detailed circuit, by which the circuit of FIG. 6 is realized. A reference voltage generating circuit 10 and a differential amplifying circuit 12 are the same as those of FIG. 2. Switches SW11, SW12, SW21 to SW24 and SW31 to SW34 are respectively constituted by CMOS switches, each of which is formed of P and N type transistors. Impedance elements are constituted by resistors r11 to r14 and r21 to r24.

When operating in a test mode at a wafer stage, a level H is applied to the external test terminal 112 and the switch SW12 becomes conductive. On the contrary, when operating in a normal mode, a level L is applied to the external test terminal 112 and the switch SW11 becomes conductive. After a chip is encapsulated in a package, the test mode detecting circuit 500 makes the test mode signal 506 go to a level L to make the switch SW11 conductive when operating in a normal mode. When operating in an acceleration test mode, the test mode detecting circuit 500 detects the test mode, makes the output 506 go to a level H and makes the switch SW12 conductive. A NOR gate 110 makes the output go to a level H both when the external test mode terminal 112 is a level H and when the test mode signal 506 of the test mode detecting circuit 500 is a level L and controls the switch SW12 conductive for test mode. As a result, when operating in a normal mode, the internal power supply voltage $V_{INT}$ goes to 3.5 V around the reference voltage $V_{FLAT}$. Alternatively, when operating in a test mode, the voltage of the internal power supply voltage $V_{INT}$ goes to 4.5 V, which is higher than the reference voltage $V_{FLAT}$.

Each of the program ROMs 400R and 400T includes two bits of memories where a fuse 402 and a resistor 404 is connected in series. Two bits of addresses are respectively written to these ROMs 400R and 400T. Addresses are written to these program ROMs 400R and 400T as adjusting signals for fine-tuning the internal power supply voltage levels $V_{INT}$ when operating in a normal mode and test mode. Then, these stored address signals PA0 and PA1 are respectively supplied to the decoders 200R and 200T through the switches 300R and 300T. Alternatively, the external address signals A0 and A1 supplied to the external address terminals A0 and A1 are also supplied to the decoders 200R and 200T through the switch circuits 300R and 300T, respectively.

A signal of the externally adjusting mode terminal 512 and the adjusting mode signals 508 and 510 switch these addresses. In other words, when the externally adjusting mode terminal 512 goes to level H or the adjusting mode signals 508 and 510 of the test mode detecting circuit 500 go to level H, the external addresses A0 and A1 are supplied to the decoders 200R and 200T. On the other hand, when the signal of the externally adjusting mode terminal 512 and the control mode signals 508 and 510 of the test mode detecting circuit 500 go to level L, the stored addresses PA0 and PA1 are supplied to the decoders 200R and 200T.

As a result, either of the selection signals S21 to S24 and either of the selection signals S31 to S34 go to level L, or therefore, either of the switches SW21 to SW24 or either of the switches SW31 to SW34 become conductive. Then, when a signal of the external test terminal 112 or a test mode signal 506 go to level H, the switches SW12 becomes conductive, the voltage fine-tuned by the addresses for testing the stress is generated at the output terminal N4. On the contrary, when both of the signal of the external test terminal 112 and a test mode signal 506 go to level L, the switch SW11 becomes conductive, and the voltage fine-tuned by the addresses for a normal operation mode is generated at the output terminal N4. These voltages are employed as internal power supply $V_{INT}$ as they are or are employed for generating internal power supply voltage $V_{INT}$ from the circuit of FIG. 5.

Figure 8:
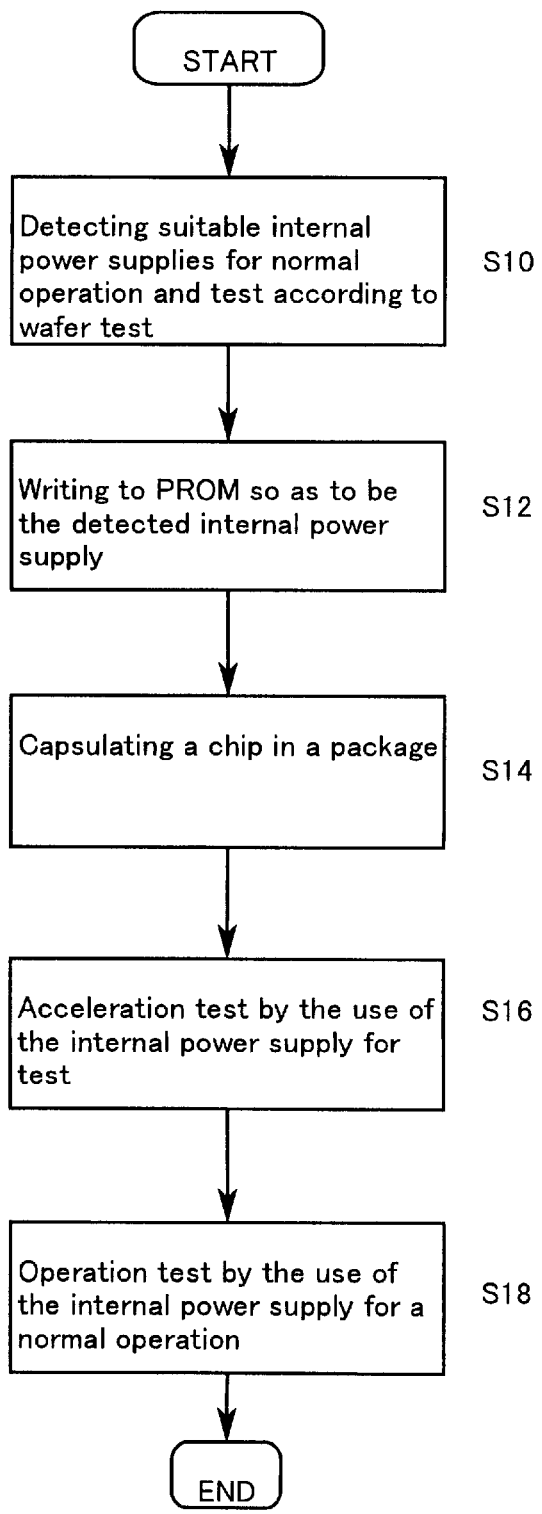
FIG. 8 shows an operational flow chart of test by employing the third embodiment.

FIG. 8 is an operational flow chart of adjusting and testing by employing the circuit of FIG. 7. The externally adjusting mode terminal 512 goes to level H and desired addresses are applied to the external addresses A0 and A1 at a wafer stage to detect suitable voltage values of the internal power supplies $V_{INT}$ when operating in normal and test modes (S10). Then, the external test terminal 112 alternatively switches the normal mode or the test mode. Then, addresses for generating the detected suitable voltage values are written to the respective ROMs 400R and 400T (S12). After that, the chip is encapsulated in a package (S14).

When it is detected to operate in an acceleration test mode according to plural commands or addresses Add after encapsulating the chip in a package, the test mode detecting circuit 500 makes the test mode signal 506 go to level H and the internal power supply voltage $V_{INT}$ go to a high voltage level for acceleration test. The internal power supply voltage $V_{INT}$ for testing is fine-tuned by addresses PA written in the internal ROM 400T. The acceleration test is executed by employing the high internal power supply voltage $V_{INT}$ (S16). However, the adjusting mode signal 510 output by the test mode detecting circuit 500 to execute the acceleration test by applying the desired address signals at the external address terminals A0 and A1. After finishing the acceleration test, the mode is returned to a normal mode, the test mode detecting circuit 500 makes the test mode signal 506 go to level L, and the internal power supply voltage $V_{INT}$ go to normal operated level. The internal power supply voltage $V_{INT}$ for normal operation is also fine-tuned by the addresses written in the internal ROM 400R. An operation test is executed by the internal power supply voltage for normal operation (S18). In the test for normal operation, the adjusting mode signal 508 output by the test mode detecting circuit 500 is also employed to test the normal operation by applying the desired address signals at the external address terminals A0 and A1 in the same way.

Command signals CMD or address signals Add are supplied to the test mode detecting circuit 500 of FIG. 7. The test mode detecting circuit 500 detects the test mode by a combination of command signals /RAS, /CAS and /WE, for example. Further, it is detected to operate in the acceleration test mode by a combination of the address signals Add. Or the acceleration test mode is detected in response to the combination of the command signals and higher voltage supplied to a specified address terminal than the usual voltage. The detecting method can be suitably selected. As described above, the test mode detecting circuit 500 further detects an adjusting mode where the internal power supply voltage levels when operating in normal mode and acceleration test mode are fine-tuned.

The above-described internal voltage generating circuit according to the present embodiments generates internal power supply voltage levels when operating in normal and test modes. However, the present invention is not restrict to an internal voltage generating circuit which detects voltages in the normal and test modes. Accordingly, a circuit in which different internal voltages are generated by selecting a connection of impedance elements can be applicable to the present invention.

As is explained above according to the present invention, provided is an internal voltage generating circuit that can generate a constant internal power supply voltage for obtaining stable operations at normal operation with respect to certain wide of voltage range of an external power supply voltage and an accurate higher internal power supply voltage at acceleration test.

Alternatively, according to the present invention, provided is an internal voltage generating circuit, which can generates an accurate value as an internal power supply voltage, which is not affected by dispersion caused by processes. Further, according to the present invention, provided is an internal voltage generating circuit, which can fine-tune the internal power supply voltages at both of normal operation and stress test operation. Furthermore, according to the present invention, provided is an internal voltage generating circuit, which can generate a constant internal power supply voltage in a first mode and generate in a second mode an accurate internal power supply voltage higher than that in the first mode.

What is claimed is:

1. An internal voltage generating circuit, which generates internal power supply voltages for a normal operation and a test operation employing an external power supply, comprising:

a reference voltage generating circuit, to which the external power supply voltage is supplied, for generating a reference voltage;

a comparator, having a first input terminal, to which the reference voltage is supplied, a second input terminal and an output terminal, for comparing voltages of the first and second input terminals and generating an output voltage at the output terminal according to the difference of the voltages; and an impedance element, which is selectively inserted between the output terminal and the second input terminal in the comparator according to the normal operation or the test operation, wherein the internal power supply voltage is generated at the output terminal of the comparator.

2. The internal voltage generating circuit according to claim 1, wherein the comparator is constituted by a differential amplifying circuit, of which first input terminal is non-inverse input terminal and second input terminal is inverse input terminal, and the output voltage is generated at the output terminal so that the difference between voltages of the first and second input terminals becomes zero.

3. The internal voltage generating circuit according to claim 2, wherein the differential amplifying circuit comprises a pair of N type transistors of which gates are respectively connected to the first and second input terminals and sources are commonly connected to a current source, and a drain of the N type transistor connected to the first input terminal is connected to the output terminal through a P type transistor.

4. The internal voltage generating circuit according to claim 1, wherein the impedance element comprises a resistor.

5. The internal voltage generating circuit according to claim 1, further comprising:

an external test terminal, to which an external test signal for identifying the normal operation or the test operation is supplied, or a test mode detecting circuit for generating an internal test signal according to an externally provided signal, wherein the impedance element is selectively connected by the external or internal test signal.

6. An internal voltage generating circuit, which generates internal power supply voltages for a normal operation and a test operation employing an external power supply, comprising:

a reference voltage generating circuit, to which the external power supply is supplied, for generating a reference voltage, to which the external power supply voltage is supplied;

a comparator, having a first input terminal, to which the reference voltage is supplied, a second input terminal and an output terminal, for comparing voltages generated at the first and second input terminals and generating an output voltage according to the difference of the voltages at the output terminal;

a first switch for selectively inserting a prescribed impedance element between the output terminal and the second input terminal of the comparator according to the normal operation or the test operation;

a second switch for selectively changing impedance values of the impedance element; and an internal memory for storing an adjusting signal for controlling the second switch, wherein the voltage of the internal power supply voltage is generated at the output terminal of the comparator.

7. The internal voltage generating circuit according to claim 6, further comprising:

an externally adjusting terminal for being supplied with the adjusting signal externally, wherein the second switch circuit is controlled by the adjusting signal from the externally adjusting terminal when adjusting, and the second switch is controlled by the adjusting signal stored in the internal memory when not adjusting.

8. The internal voltage generating circuit according to claim 7, wherein the externally adjusting terminal is shared with a prescribed input terminal for normal operation.

9. An internal voltage generating circuit, which generates a first internal voltage in a first mode and a second internal voltage in a second mode employing an externally supplied voltage, comprising:

a reference voltage generating circuit, to which the external power supply is supplied, for generating a reference voltage, to which the external power supply voltage is supplied;

a comparator, including a first input terminal, to which the reference voltage is supplied, a second input terminal and an output terminal, for comparing voltages of the first and second input terminals and generating an output voltage at the output terminal so as to reduce the difference between the voltages of the first and second input terminals; and prescribed impedance elements, which are selectively inserted between the output terminal and the second input terminal in the comparator, wherein voltages of the first and second internal power supplies are generated at the output terminal of the comparator.

\* \* \* \* \*